(12) United States Patent
Turner

(10) Patent No.: US 6,618,581 B1
(45) Date of Patent: Sep. 9, 2003

(54) RADIO WITH PRE-SELECTED LOCKED CHANNELS FOR CHILDREN

(76) Inventor: David F. Turner, P.O. Box 428581, Cincinnati, OH (US) 45242

( * ) Notice: Subject to any disclaimer, the term of this patent is extended or adjusted under 35 U.S.C. 154(b) by 0 days.

(21) Appl. No.: 09/562,241

(22) Filed: Apr. 28, 2000

Related U.S. Application Data

(60) Provisional application No. 60/131,341, filed on Apr. 28, 1999.

(51) Int. Cl.[7] ............................ H04B 1/06; H05K 11/02
(52) U.S. Cl. ...................... 455/345; 455/344; 455/347; 455/348
(58) Field of Search ................................ 455/345, 344, 455/347, 348, 349; D14/188, 193; 334/85; 379/445

(56) References Cited

U.S. PATENT DOCUMENTS

| | | | |
|---|---|---|---|
| 3,704,422 A | * 11/1972 | Thomson | 455/164.1 |
| 3,824,472 A | * 7/1974 | Engel et al. | 455/343.1 |
| 3,913,041 A | 10/1975 | Weenink | |
| 4,232,396 A | * 11/1980 | Grimes | 725/26 |
| 4,297,539 A | * 10/1981 | Fairbanks | 379/445 |
| 4,463,618 A | 8/1984 | Ohashi | |
| 4,468,976 A | 9/1984 | Chaki et al. | |
| 4,510,623 A | 4/1985 | Bonneau et al. | |
| 4,768,229 A | 8/1988 | Benjamin et al. | |
| 4,772,079 A | * 9/1988 | Douglas et al. | 312/257.1 |
| 4,888,796 A | 12/1989 | Olivo, Jr. | |
| 5,051,837 A | 9/1991 | McJunkin | |
| 5,485,518 A | 1/1996 | Hunter et al. | |
| 5,548,345 A | 8/1996 | Brian et al. | |
| 5,583,576 A | 12/1996 | Periman et al. | |
| 5,663,756 A | 9/1997 | Blahut et al. | |
| 5,705,975 A | * 1/1998 | Serino et al. | 340/426.34 |
| 6,094,194 A | * 7/2000 | Jackson | 345/717 |

* cited by examiner

Primary Examiner—Vivian Chin
Assistant Examiner—Lewis West
(74) Attorney, Agent, or Firm—Charles R. Wilson

(57) ABSTRACT

A radio for use by juveniles, particularly young children and pre-teens has dedicated channel selectors which are pre-set by a responsible adult and locked-in. The radio comprises a housing, a tuner compartment mounted in the housing, a full channel selector positioned in the tuner compartment and accessible only by the adult, a set of dedicated channel selectors mounted on the housing and accessible by the juvenile and a receiving unit mounted in the housing. The tuner compartment is secured by an access cover. The adult initially accesses the full channel selector and, in conjunction with the dedicated channel selectors, programs the radio so that the child accessible dedicated channel selectors tune in only those radio frequencies which the adult desires. The access cover has means to secure it such that only the adult can gain access to the full channel selector for initial dedicated channel selection and intermittent fine tuning and/or channel substitution.

11 Claims, 1 Drawing Sheet

RADIO WITH PRE-SELECTED LOCKED CHANNELS FOR CHILDREN

This application claims the benefit of U.S. Provisional Application No. 60/131,341, filed Apr. 28, 1999.

FIELD OF THE INVENTION

This invention relates to a radio especially intended for use by juveniles under the age of about thirteen, i.e. young children and pre-teens. More particularly, the invention relates to a radio having channels which are selected and lockable by a responsible adult to limit child access to the pre-selected channels.

BACKGROUND OF THE INVENTION

Radio usage is widespread. Virtually every household has at least one radio. Most radios are for general use by every member of the household. Some radios, though, are manufactured particularly for young children and pre-teens. They may be uniquely shaped or colored to appeal to the child. They typically have only basic radio features to keep their cost down. Earplugs may or may not be provided for private listening purposes.

Larger metropolitan areas typically have many radio broadcasting stations. While more rural areas have less local broadcasting stations, radios in such areas can routinely or at least occasionally pick up radio signals from far flung areas. Most of the broadcasts currently being sent over the airways are undeniably socially acceptable. A wide range of entertaining music is available as is a wide range of informative talk show formats available.

In recent years, some radio stations have been broadcasting music and talk show topics which apparently meet the Federal Communications Commission's guidelines, but which many people, parents of young children in particular, consider objectionable. For example, shock radio appears to be in vogue. The adult listener who objects to such radio shows can simply select a radio channel which is known to have an acceptable broadcasting content. The adult may be annoyed and even disgusted, but can readily change channels to something more desireable.

There are many parents in particular who object to their children listening to certain radio broadcasts. However, the parent of young children who wants to control the radio channels listened to by the children has a difficult task. When a child has a radio with earphones, the parent has no idea as to what station is being listened to. Also, given the portability of radios and the simple manner of "dialing" in a radio channel, a child in actual fact is free to select whatever radio channel is desired. A total ban on radio usage by the child is unreasonable. Around the clock supervision of radio usage is impossible.

There is a need for parents to limit or control broadcasts received by their children's radios. U.S. Pat. Nos. 4,888,796 and 5,485,518 disclose radios which have electronic screening devices or signal recognition devices which have the capability of blocking reception of that particular frequency by the radio. However, such devices likely add significantly to the cost of the radio and have not enjoyed commercial success. A radio is needed which has only pre-selected approved radio channels which are accessible to the child. The pre-selection of the approved radio channels must be done by the parent given varying parental standards and the fact channels vary from city to city. Of course, any such radio must be economical to produce to retain the low cost to the consumer. The radio must also be easy for the parent to pre-select and lock-in approved radio channels. The child's ability to easily select one of the several pre-selected approved channels must be maintained. At the same time, the child's access to other channels on the radio must be strictly limited and preferably not possible without the parent's participation.

In accord with a need which many people feel is desireable, there has now been developed a radio having means for a parent to pre-select a number of approved radio channels and effectively block-out access to other non-selected radio channels. The radio is economical to produce, easy for the parent to pre-select channels, and gives the child the ability to select one of several pre-selected channels.

SUMMARY OF THE INVENTION

A radio is configured whereby a finite number of radio channels are pre-selected by a responsible adult. The radio allows a young child or pre-teen access to the pre-selected channels, but not other channels. The radio comprises a housing having a tuner compartment with a full channel selector. The full channel selector is accessible by the adult to pre-select a finite number of radio channels, but not readily accessible by the young child or pre-teen. The radio also has a set of dedicated channel selectors operably connected to the receiving unit and accessible by the child or pre-teen. Means are provided to limit access to the full channel selector whereby only the responsible adult can operate it. Approved channels are selected by the adult and each approved channel is locked-in to be accessed by the child and pre-teen using the dedicated channel selectors.

DETAILED DESCRIPTION OF THE INVENTION

The radio of the invention is manufactured for particular use by juveniles under the age of about thirteen. The radio can be variously shaped and sized. It includes all manner of radios, e.g. home use cord radios, portable radios, radios with means for also playing a cassette tape or CD, and alarm clock radios.

As used throughout here, the terms child, young children and pre-teen(s) are used to describe the age group of juveniles for whom the radio of the invention is intended. While most useful in homes with young children and pre-teens, it can be used elsewhere, e.g. institutions where it is decreed that inmates or patients be provided with only selected music and talk show formats. However, the radio is particularly useful in homes where the parents of young children and pre-teen(s) desire to limit the radio channels available for listening by their children and, for this reason, is referenced in the following description.

Figure 1:
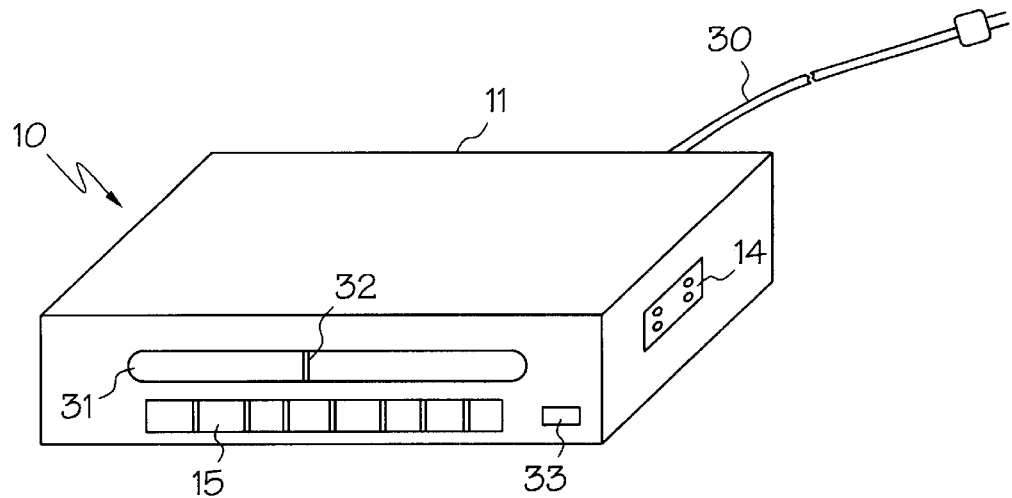
FIG. 1 is a perspective view of the radio of the invention.
Figure 2:
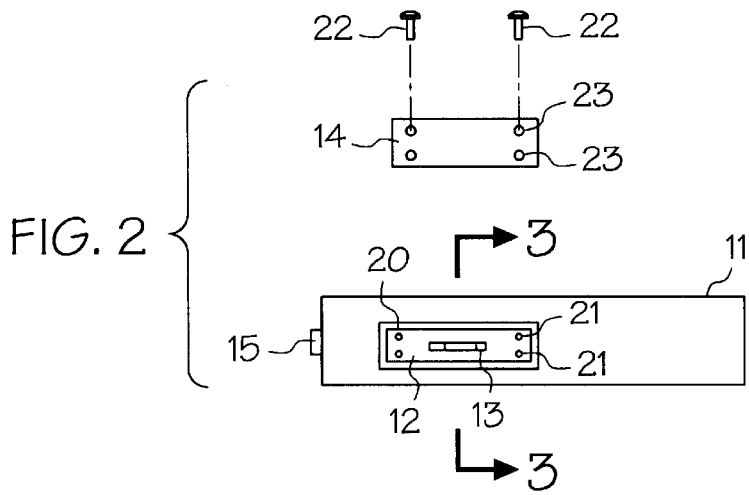
FIG. 2 is a side view in elevation of the radio of FIG. 1 and with an access cover removed to reveal a tuner compartment and a full channel selector.

With reference to FIGS. 1 and 2 of the drawings, the radio 10 of the invention has a housing 11, a tuner compartment 12, a full channel selector 13 positioned in the tuner compartment, a secured tuner compartment access cover 14 and a set of dedicated channel selectors 15. A receiving unit 16, shown in schematic form in FIG. 2, is for the wireless reception of radio frequency bands. The receiving unit 16 is permanently mounted in the housing 11. The aforementioned components are essential. Operation of the radio is described in the following paragraphs. A description in detail of the essential radio components and their interactions also follows. The radio 10 is configured for the responsible adult to readily pre-select the desired channels. The radio is also configured for easy use by the child. Briefly, and with reference to FIG. 2, the tuner compartment 12 and the full channel selector 13 are revealed when the channel access cover 14 is removed. As with a conventional radio, the channel selector 13, once accessed, is capable of being rotated and tuned to any radio station band wavelength which is being broadcast and within reach of the radio. In use, the parent adjusts the full channel selector 13 until a broadcast from an acceptable radio channel is received. One of the dedicated channel selectors is then activated to lock-in that particular band wavelength, i.e. radio channel. The full channel selector is further adjusted until a broadcast from another acceptable radio channel is received and then a second dedicated channel selector activated to lock-in that second radio channel. The process is continued until each of the dedicated channel selectors has a single radio channel associated with it.

Again with reference to FIG. 1, the housing 11 is box-shaped with rectangular walls. It can have other shapes, including stylistic curved wall shapes. Preferably, it is made of a rigid plastic. It can comprise individual walls attached together by screws or other attaching means or it can be a one piece molded unit. It has a hollow interior of sufficient capacity to hold the radio's receiving unit 16. While now shown, the interior of the housing is accessed through a removable side wall, bottom wall or wall panel.

The tuner compartment 12 is depicted as recessed from a side wall of the housing 11. It could as well be located in a front wall, back wall, top wall or bottom wall. The compartment itself is defined by a set of interior rigid walls. The tuner compartment 12 is sized to accommodate the full channel selector 13. As shown, the full channel selector is a dial which is mounted for reversible rotation. Such selectors are considered variable tuning elements. They are well known and commercially available. Other full channel selectors of different configurations can be used. The channel selector 13 is in communication with the receiving unit 16.

Figure 3:
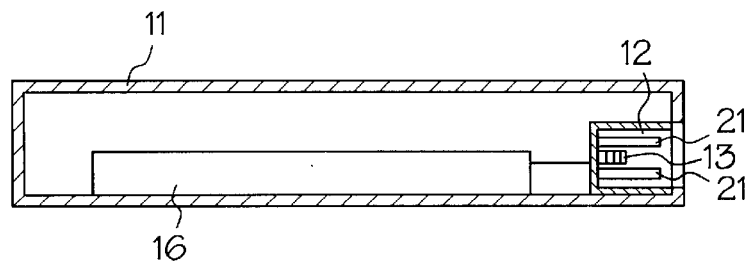
FIG. 3 is a sectional view of the radio of FIG. 2 taken along line 3—3 thereof to show the tuner compartment of the radio.

The tuner compartment access cover 14 depicted in FIGS. 1 and 2 is used to secure the tuner compartment 12. As best seen in FIGS. 2 and 3, the tuner compartment 12 has a peripheral ledge 20 at the housing's surface extending around the opening. It also has four screw posts 21 in the four corners of the compartment. Each of the screw posts 21 has a screw receiving bore. Preferably, each bore has a recessed shoulder to receive a screw's head and is threaded therebelow to threadingly hold the screw. Such a configuration limits access to the screws 22 and accordingly, makes it more difficult for a child to remove the screws. The access cover 14 is dimensioned to sit on the peripheral ledge. The cover has screw holes 23 in its four corners, which are in alignment with the bores of the screw posts. As should be apparent, the access cover once positioned in place and the screws 22 tightened secures the tuner compartment and renders the full channel selector 13 unaccessible. Access to the screws 22 is somewhat limited. A small screwdriver is needed which a child likely does not possess. A certain degree of dexterity is also needed which many children, especially pre-school age children, do not have.

Other compartment access covers of varying designs and modes of operation can be used in place of the access cover 14 depicted in FIGS. 1–3. Spring-loaded access covers which require a pushing force coupled with a manipulative moving force are feasible. Such covers currently found on electronic toys and devices which are designed to limit access to batteries are useful with the radio of this invention. In part, the access cover selected will be based on the particular age of the child being targeted for radio sale and use. The older the child, the more difficult the cover must be to remove.

The set of dedicated channel selectors 15 are positioned on an outside surface of the housing 11 so as to be readily accessed by the young child or pre-teen. The dedicated channel selectors depicted in FIGS. 1 and 2 are push-button channel selectors. They are conventional and are commercially available. U.S. Pat. Nos. 4,463,618 and 4,468,976 contain detailed descriptions of acceptable push-button channel selectors and are incorporated by reference herein. Eight push-button channel selectors 15 are depicted in FIG. 1. A greater or lesser number can be used depending on user preference and housing size considerations. Preferably, from four to twelve push-button channel selectors are provided. Each of the push-buttons is operably connected to the receiving unit 16. In use, a push-button is pulled out to disengage it. A channel is selected using the full channel selector and then the push-button pushed back to lock-in that channel. At that point, the particular push-button has a pre-selected dedicated channel operatively associated with it. Thereafter, pushing in that button by the young child or pre-teen will activate the pre-selected dedicated channel.

Still other dedicated channel selectors can be used. Modern day autos in particular have such channel selectors. They come in various mechanical forms which are activated simply by pushing, pulling, or moving a button or switch in some manner to receive the dedicated channel. Any dedicated channel selector commonly used for tuning a radio into a desired channel is usable in the radio of this invention.

The receiving unit 16 is also conventional and commercially available from several sources. It is secured to the housing and operatively connected to the full channel selector and to the dedicated channel selectors.

Numerous auxiliary or add-on means of securing the tuner compartment are also possible. For example, an access cover with a clasp and lock can be used. A combination lock built into the radio or a radio with mounting means to accommodate the combination lock are further examples of means to secure the tuner compartment. Still other means of limiting access to the channel selector are contemplated.

While not shown in detail, the radio of the invention has conventional features. It can be powered by electricity from a wall outlet and for this purpose an electric cord with plug 30 is provided. The radio can alternatively or in addition to the electric cord be battery powered. A channel indicator display window 31 with a numeric channel menu and channel indicator 32 can be provided or a digital channel read-out indicator can be provided. The radio can be AM only or can be AM/FM with a simple selection switch provided. On/off switches 33 of different natures can be used. Still other common radio features can be used with the radio of this invention.

Having described the invention in its preferred embodiment, it should be clear that modifications can be made without departing from the spirit of the invention. It is not intended that the words used to describe the invention nor the drawings illustrating the same be limiting on the invention. It is intended that the invention only be limited by the scope of the appended claims.

I claim:

1. A radio with pre-selected locked radio channels for limiting access to approved radio channels, comprising:
   (a) a housing;
   (b) a receiving unit mounted in the housing for the wireless reception of radio frequency bands;
   (c) a tuner compartment associated with the housing with a full channel selector positioned within the tuner compartment and further in communication with the receiving unit for selecting a radio broadcast frequency;
   (d) an access cover enclosing the tuner compartment and secured to the housing in a manner which limits access to the full channel selector within the tuner compartment; and
   (e) a set of dedicated channel selectors positioned on the housing for access by an individual and operably connected to the receiving unit,
   whereby the full channel selector is accessed by a responsible person to select a set of approved radio channels and to lock-in said channels with the dedicated channel selectors so that when the access cover is secured, a radio channel is solely selected by use of the dedicated channel selectors.

2. The radio of claim 1 wherein the access cover is secured to the tuner compartment by screws.

3. The radio of claim 2 wherein a set of screw posts are mounted in the tuner compartment to extend perpendicularly to the access cover and the access cover has aligned screw holes whereby the screws extend through the access cover and into the screw posts whereby access to full channel selector within the tuner compartment is accessed by removing the screws from the access cover and removing the access cover to fully expose the full channel selector.

4. The radio of claim 1 wherein the access door is spring-loaded such that it must be pushed inwardly to free it from the housing.

5. The radio of claim 1 wherein the access door has a clasp to interact with a wall of the tuner compartment and further the clasp is rotated by a key to lock or unlock the access door.

6. The radio of claim 1 wherein the full channel selector is a rotatable dial.

7. The radio of claim 1 wherein the dedicated channel selectors are push-button channel selectors.

8. The radio of claim 7 wherein there are from four to twelve push-button channel selectors.

9. A radio with pre-selected locked radio channels for limiting access to approved radio channels, comprising:
   (a) a housing;
   (b) a receiving unit mounted in the housing for the wireless reception of radio frequency bands;
   (c) a tuner compartment mounted within the housing with a full channel selector dial therein and in communication with the receiving unit for selecting a radio broadcast frequency;
   (d) an access cover secured to the housing to enclose the tuner compartment for limiting access to the full channel selector dial within the tuner compartment; and
   (e) from four to twelve push-button channel selectors positioned on the housing for access by the child and each said push-button channel selector operably connected to the receiving unit,
   whereby the full channel selector dial is accessed by a responsible person to select a set of approved radio channels and to lock-in said channels with the push-button channel selectors so that when the access cover is secured, a radio channel is solely selected by the child by use of the push-button channel selectors.

10. The radio of claim 9 wherein the access cover is secured to the tuner compartment by screws.

11. The radio of claim 10 wherein a set of screw posts are mounted in the tuner compartment to extend perpendicularly to the access cover and the access cover has aligned screw holes whereby the screws extend through the access cover and into the screw posts whereby access to full channel selector within the tuner compartment is accessed by removing the screws from the access cover and removing the access cover to fully expose the full channel selector.

* * * * *